United States Patent
Ho et al.

(10) Patent No.: US 9,437,478 B2
(45) Date of Patent: * Sep. 6, 2016

(54) CHIP PACKAGE AND METHOD FOR FORMING THE SAME

(71) Applicant: XINTEC INC., Jhongli, Taoyuan County (TW)

(72) Inventors: Yen-Shih Ho, Kaohsiung (TW);
Tsang-Yu Liu, Zhubei (TW);
Shu-Ming Chang, New Taipei (TW);
Yu-Lung Huang, Daxi Township (TW);
Chao-Yen Lin, New Taipei (TW);
Wei-Luen Suen, New Taipei (TW);
Chien-Hui Chen, Zhongli (TW);
Ho-Yin Yiu, Hong Kong (CN)

(73) Assignee: XINTEC INC., Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/339,360

(22) Filed: Jul. 23, 2014

(65) Prior Publication Data

US 2014/0332908 A1    Nov. 13, 2014

Related U.S. Application Data

(63) Continuation-in-part of application No. 13/950,101, filed on Jul. 24, 2013, now Pat. No. 8,952,501, which is a continuation-in-part of application No. 13/105,775, filed on May 11, 2011, now Pat. No. 8,507,321.

(60) Provisional application No. 62/002,774, filed on May 23, 2014, provisional application No. 61/333,459, filed on May 11, 2010.

(51) Int. Cl.
*H01L 21/768*    (2006.01)
*H01L 23/31*    (2006.01)
(Continued)

(52) U.S. Cl.
CPC ..... *H01L 21/76802* (2013.01); *G06K 9/00053* (2013.01); *H01L 21/561* (2013.01); *H01L 21/76877* (2013.01); *H01L 23/3121* (2013.01); *H01L 24/05* (2013.01); *H01L 23/3135* (2013.01); *H01L 23/3192* (2013.01); *H01L 23/525* (2013.01); *H01L 23/5329* (2013.01); *H01L 24/06* (2013.01); *H01L 24/32* (2013.01); *H01L 24/45* (2013.01); *H01L 24/48* (2013.01); *H01L 24/73* (2013.01); *H01L 2224/024* (2013.01); *H01L 2224/02381* (2013.01);
(Continued)

(58) Field of Classification Search
None
See application file for complete search history.

(56) References Cited

U.S. PATENT DOCUMENTS 5,478,781 A    12/1995    Bertin et al.
7,199,345 B1    4/2007    Meisel et al.
(Continued)

FOREIGN PATENT DOCUMENTS

CN    103107153    5/2013
JP    2002-151546    5/2002
(Continued)

*Primary Examiner* — Michelle Mandala
(74) *Attorney, Agent, or Firm* — Liu & Liu (57) ABSTRACT

A chip package including a chip is provided. The chip includes a sensing region or device region adjacent to an upper surface of the chip. A sensing array is located in the sensing region or device region and includes a plurality of sensing units. A plurality of first openings is located in the chip and correspondingly exposes the sensing units. A plurality of conductive extending portions is disposed in the first openings and is electrically connected to the sensing units, wherein the conductive extending portions extend from the first openings onto the upper surface of the chip. A method for forming the chip package is also provided.

27 Claims, 8 Drawing Sheets

(51) Int. Cl.
*H01L 21/56* (2006.01)
*G06K 9/00* (2006.01)
*H01L 23/00* (2006.01)
*H01L 23/525* (2006.01)
*H01L 23/532* (2006.01)

(52) U.S. Cl.
CPC ............... *H01L2224/04042* (2013.01); *H01L 2224/0569* (2013.01); *H01L 2224/05548* (2013.01); *H01L 2224/05554* (2013.01); *H01L 2224/05558* (2013.01); *H01L 2224/05567* (2013.01); *H01L 2224/05572* (2013.01); *H01L 2224/05611* (2013.01); *H01L 2224/05624* (2013.01); *H01L 2224/05644* (2013.01); *H01L 2224/05647* (2013.01); *H01L 2224/05655* (2013.01); *H01L 2224/05669* (2013.01); *H01L 2224/05687* (2013.01); *H01L 2224/06135* (2013.01); *H01L 2224/32145* (2013.01); *H01L 2224/32225* (2013.01); *H01L 2224/45144* (2013.01); *H01L 2224/4869* (2013.01); *H01L 2224/48091* (2013.01); *H01L 2224/48145* (2013.01); *H01L 2224/48227* (2013.01); *H01L 2224/48611* (2013.01); *H01L 2224/48624* (2013.01); *H01L 2224/48644* (2013.01); *H01L 2224/48647* (2013.01); *H01L 2224/48655* (2013.01); *H01L 2224/48669* (2013.01); *H01L 2224/48687* (2013.01); *H01L 2224/73265* (2013.01); *H01L 2224/94* (2013.01); *H01L 2924/00014* (2013.01); *H01L 2924/10253* (2013.01); *H01L 2924/12041* (2013.01); *H01L 2924/14* (2013.01); *H01L 2924/1461* (2013.01)

(56) References Cited

U.S. PATENT DOCUMENTS

| | | |
|---|---|---|
| 8,736,080 B2 | 5/2014 | Arnold et al. |
| 2008/0030207 A1* | 2/2008 | Vermesan .......... G06K 9/00026 324/687 |
| 2008/0096321 A1* | 4/2008 | Lin et al. ...................... 438/113 |
| 2008/0315407 A1 | 12/2008 | Andrews, Jr. et al. |
| 2011/0241216 A1* | 10/2011 | Tada et al. ..................... 257/773 |
| 2011/0278724 A1 | 11/2011 | Lin et al. |
| 2013/0285240 A1* | 10/2013 | Last et al. ..................... 257/738 |
| 2013/0343022 A1* | 12/2013 | Hu et al. ....................... 361/761 |

FOREIGN PATENT DOCUMENTS

| | | |
|---|---|---|
| JP | 2004-363400 | 12/2004 |
| TW | 201140779 | 11/2011 |

* cited by examiner

CHIP PACKAGE AND METHOD FOR FORMING THE SAME

CROSS REFERENCE TO RELATED APPLICATIONS

This application claims the benefit of U.S. Provisional Application No. 62/002,774, filed May 23, 2014 and is a Continuation-In-Part of U.S. patent application Ser. No. 13/950,101, filed Jul. 24, 2013, which is a Continuation-In-Part of U.S. Pat. No. 8,507,321, filed May 11, 2011, which claims the benefit of U.S. Provisional Application No. 61/333,459, filed May 11, 2010, the entirety of which are incorporated by reference herein.

BACKGROUND OF THE INVENTION

1. Field of the Invention

The invention relates to chip-package technology, and in particular to a chip package and methods for forming the same.

2. Description of the Related Art

The chip packaging process is an important step during the fabrication of an electronic product. Chip packages not only protect the chips therein from outer environmental contaminants, but also provide electrical connection paths between electronic elements inside and outside of the chip packages.

Figure 1:
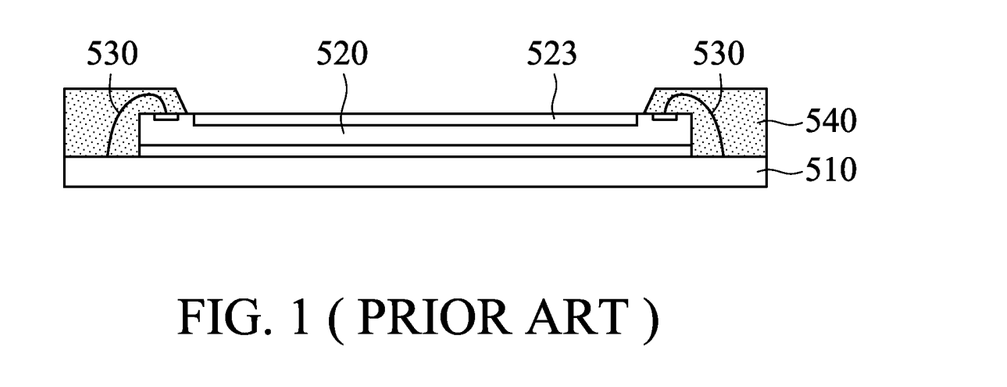
FIG. 1 is a cross-sectional view of a conventional chip package.

A conventional chip package having sensing functions, such as a fingerprint-recognition chip package shown in FIG. 1, is formed by disposing a fingerprint-recognition chip 520 on a printed circuit board 510. Wires 530 are bonded from a contact pad region on an upper surface of the chip 520 to the printed circuit board 510. The fingerprint-recognition chip 520 is then covered by an encapsulant layer 540. The thickness of the encapsulant layer 540 cannot be reduced due to the height of the wires 530 protruding from the upper surface of the chip 520. In order to prevent the sensitivity of the sensing region 523 from being affected by the thick encapsulant layer 540, the side height of the periphery of the packaged fingerprint-recognition chip 520 is higher than that of the sensing region 523 in the center thereof. In addition, since the wires 530 are adjacent to the edges of the fingerprint-recognition chip 520, they easily contact the chip edges during the bonding process which may result in a short circuit or a broken circuit, thereby reducing the yield.

Thus, there exists a need in the art for development of a chip package and methods for forming the same capable of reducing the thickness of the encapsulant layer thereby improving the sensitivity of the chip package and providing a chip package having a flat contacting surface and sufficient protection and structural strength.

BRIEF SUMMARY OF THE INVENTION

An embodiment of the invention provides a chip package comprising a chip. The chip comprises a sensing region or device region adjacent to an upper surface of the chip. A sensing array is located in the sensing region or device region and comprises a plurality of sensing units. A plurality of first openings is located in the chip and correspondingly exposes the sensing units. A plurality of conductive extending portions is disposed in the first openings and is electrically connected to the sensing units, wherein the conductive extending portions extend from the first openings onto the upper surface of the chip.

An embodiment of the invention provides a method for forming a chip package comprising providing a chip. The chip comprises a sensing region or device region adjacent to an upper surface of the chip. A sensing array is located in the sensing region or device region and comprises a plurality of sensing units. A plurality of first openings is formed in the chip to correspondingly expose the plurality of sensing units. A plurality of conductive extending portions is formed in the first openings to electrically connect to the sensing units, wherein the conductive extending portions extend from the first openings onto the upper surface of the chip.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. The disclosed contents of the present disclosure include all the embodiments derived from claims of the present disclosure by those skilled in the art. In addition, the present disclosure may repeat reference numbers and/or letters in the various embodiments. This repetition is for the purpose of simplicity and clarity, and does not imply any relationship between the different embodiments and/or configurations discussed. Furthermore, when a first layer is referred to as being on or overlying a second layer, the first layer may be in direct contact with the second layer, or spaced apart from the second layer by one or more material layers.

A chip package according to an embodiment of the present invention may be used to package micro-electro-mechanical system chips. However, embodiments of the invention are not limited thereto. For example, the chip package of the embodiments of the invention may be implemented to package active or passive devices or electronic components of integrated circuits, such as digital or analog circuits. For example, the chip package is related to optoelectronic devices, micro-electro-mechanical systems (MEMS), microfluidic systems, and physical sensors measuring changes to physical quantities such as heat, light, capacitance, pressure, and so on. In particular, a wafer-level package (WSP) process may optionally be used to package semiconductor chips, such as image-sensor elements, light-emitting diodes (LEDs), solar cells, RF circuits, accelerators, gyroscopes, microactuators, surface acoustic wave devices, pressure sensors, ink printer heads, and so on.

The above-mentioned wafer-level package process mainly means that after the package step is accomplished during the wafer stage, the wafer with chips is cut to obtain individual packages. However, in a specific embodiment, separated semiconductor chips may be redistributed on a carrier wafer and then packaged, which may also be referred to as a wafer-level package process. In addition, the above-mentioned wafer-level package process may also be adapted to form a chip package having multi-layer integrated circuit devices by stacking a plurality of wafers having integrated circuits.

Figure 2A:
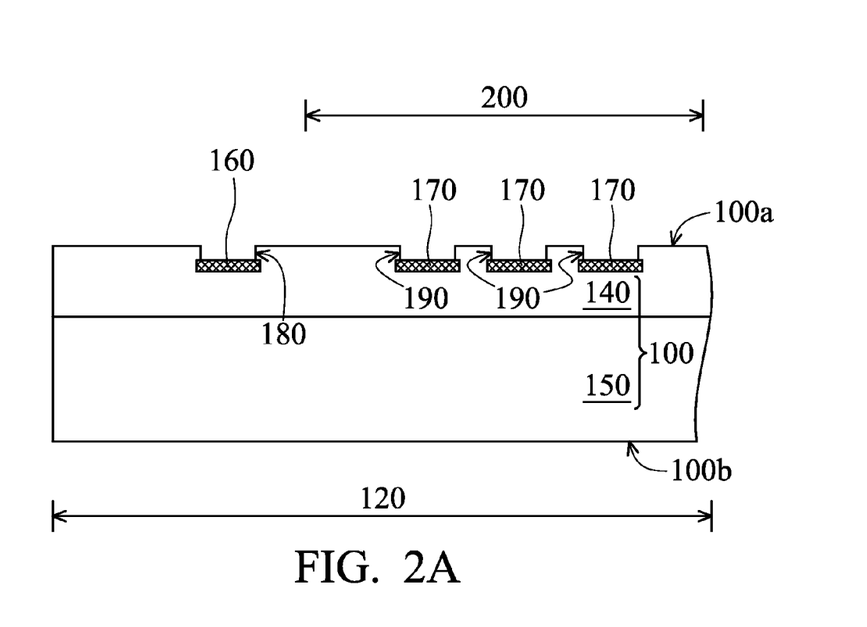
FIGS. 2A-2G are cross-sectional views of an exemplary embodiment of a method for forming a chip package according to the invention.
Figure 2B:
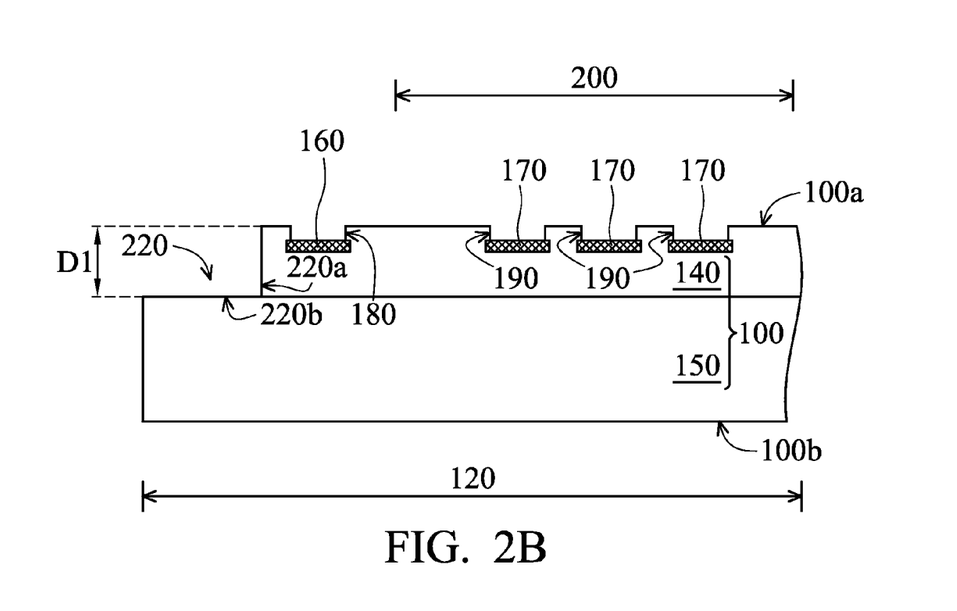
Figure 2C:
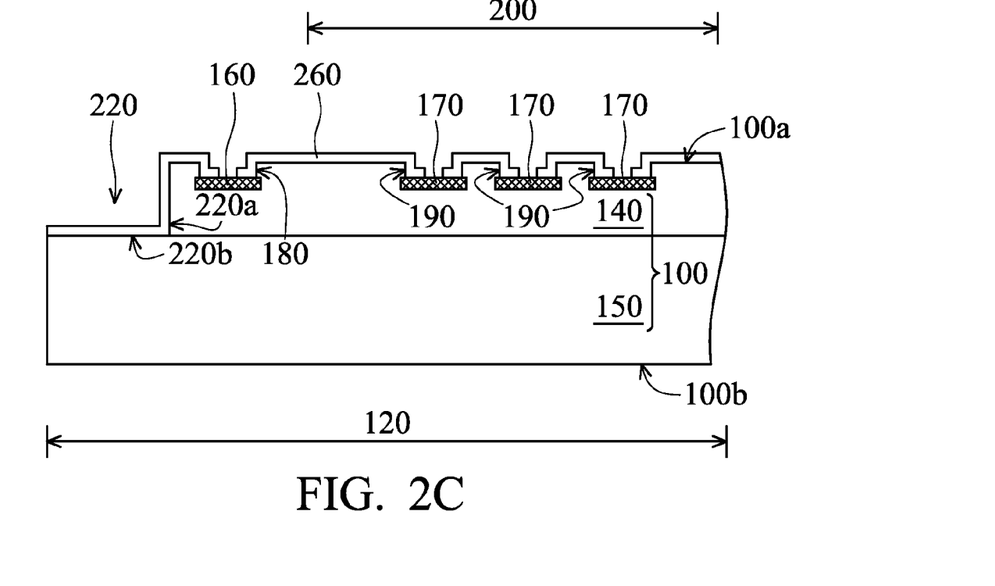
Figure 2D:
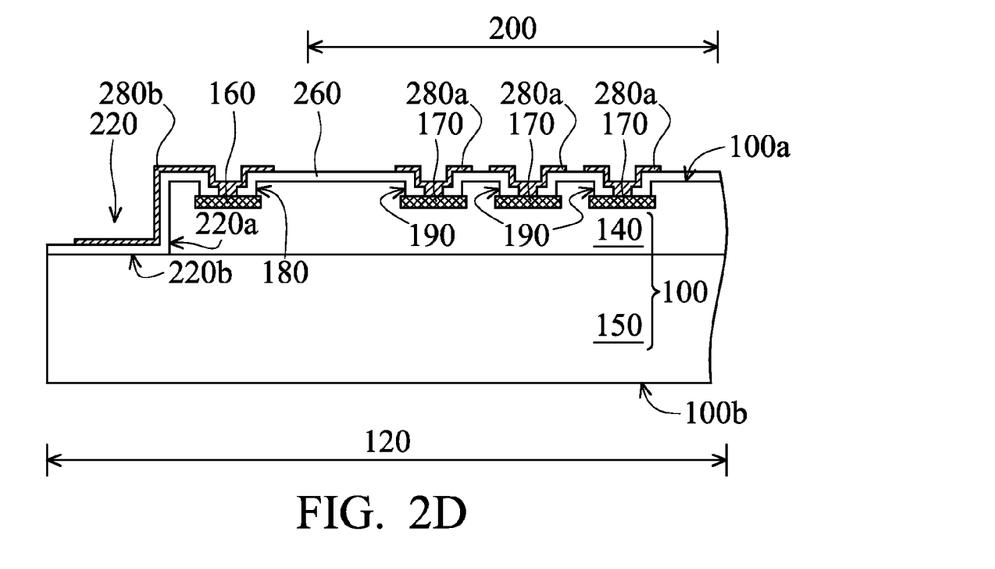
Figure 2E:
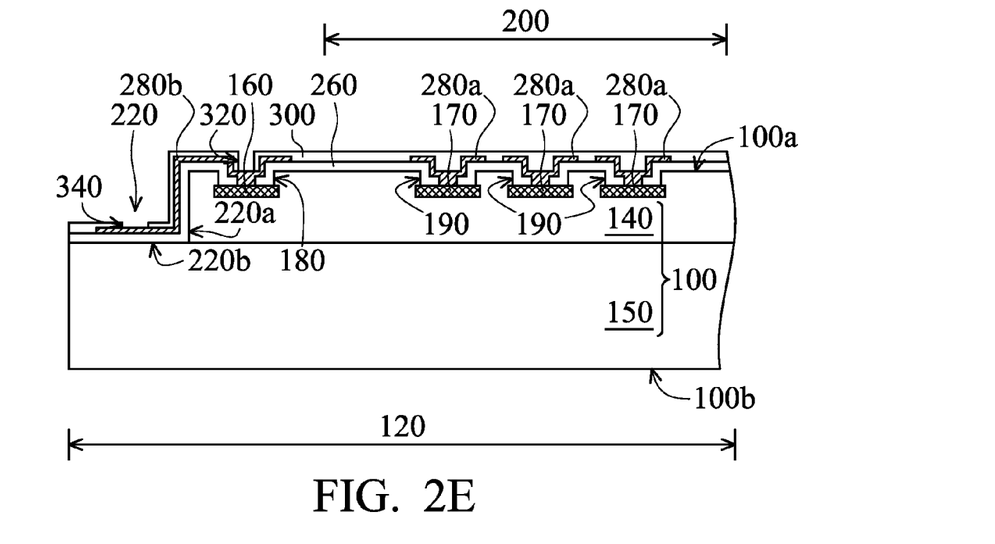
Figure 2F:
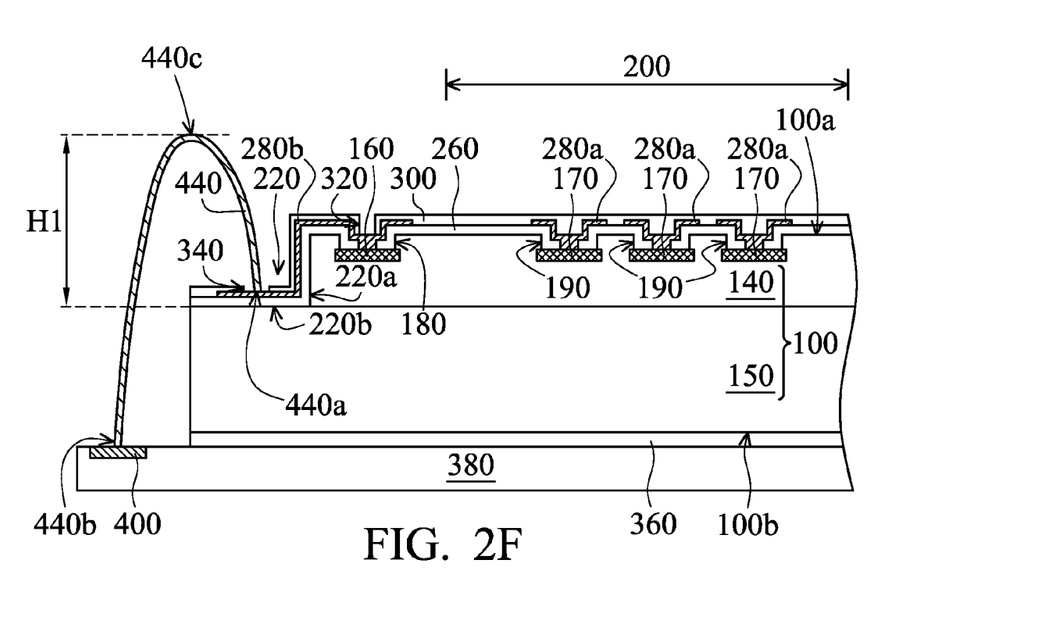
Figure 2G:
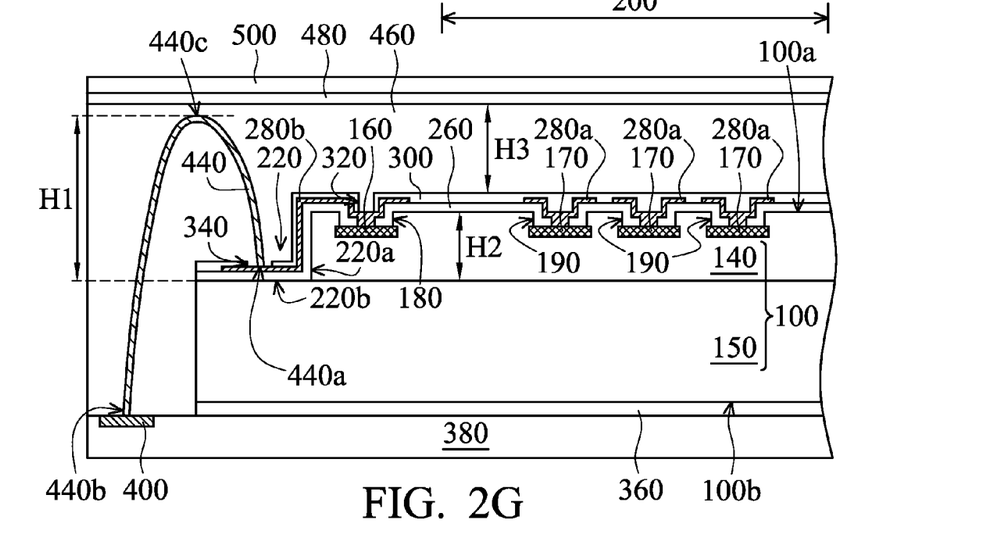

Referring to FIG. 2G, a cross-sectional view of an exemplary embodiment of a chip package according to the invention is illustrated. In the embodiment, the chip package comprises a chip 100, a plurality of first openings 190 and a plurality of conductive extending portions 280a. The chip 100 has an upper surface 100a and a lower surface 100b. In one embodiment, the chip 100 comprises an insulating layer 140 adjacent to the upper surface 100a and an underlying substrate 150 adjacent to the lower surface 100b. In general, the insulating layer 140 may comprise an interlayer dielectric (ILD), an inter-metal dielectric (IMD) and a passivation layer. In the embodiment, the insulating layer 140 may comprise inorganic materials, such as silicon oxide, silicon nitride, silicon oxynitride, metal oxide, a combination thereof, or another suitable insulating material. In the embodiment, the substrate 150 may comprise silicon or another semiconductor material.

Figure 6:
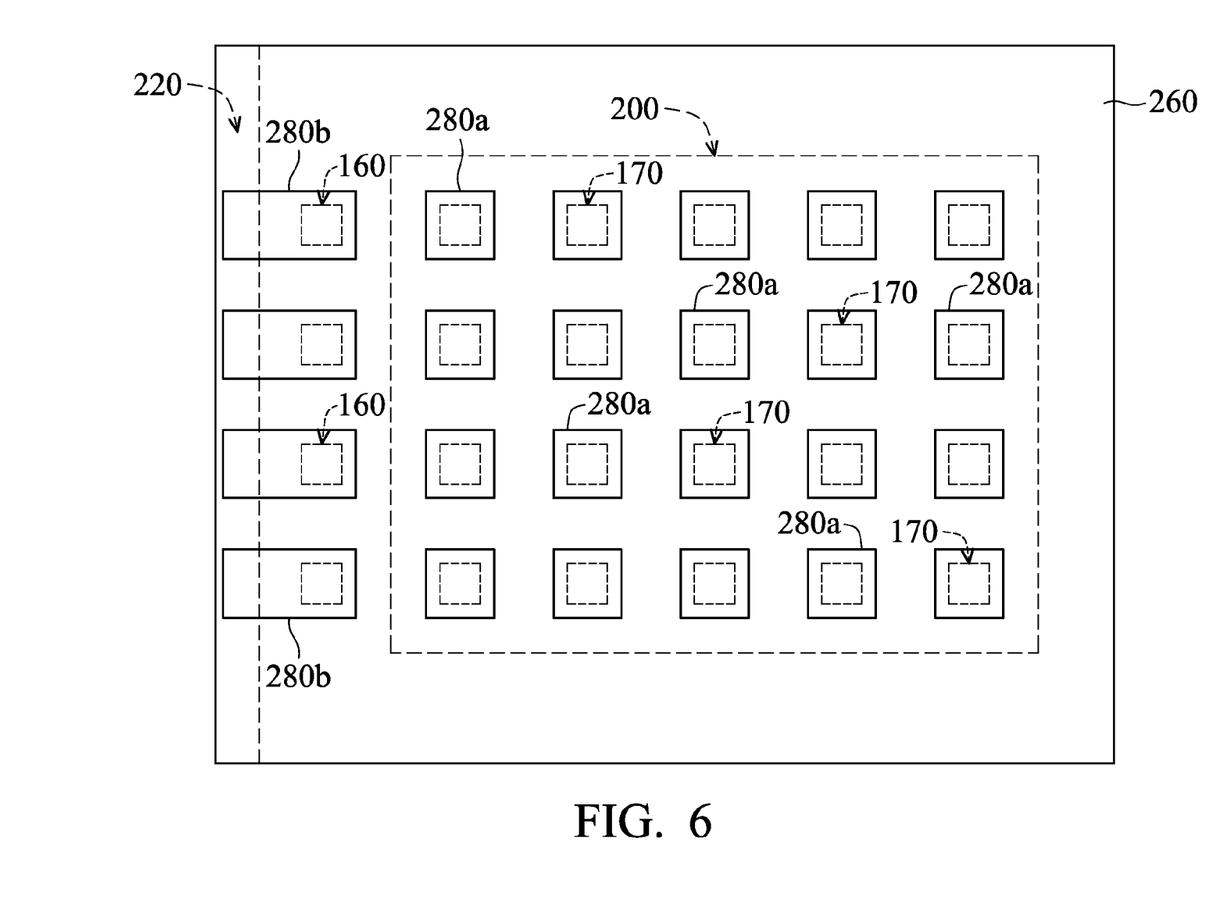
FIG. 6 is a plan view of an exemplary embodiment of a chip package according to the invention.

In the embodiment, the chip 100 comprises a signal pad region 160 and a sensing region or device region 200 which may be adjacent to the upper surface 100a. In one embodiment, the sensing region or device region 200 may be used for sensing capacitance. For example, the chip 100 may be a RF/capacitive fingerprint-recognition chip. The sensing region or device region 200 comprises a sensing array as shown in FIG. 6. The sensing array comprises a plurality of sensing units 170 in the insulating layer 140 and electrically connected to the signal pad region 160. In one embodiment, the sensing units 170 may be a single conducting layer, such as a top metal layer of an interconnection structure, or comprise multiple conducting layers. To simplify the diagram, only a single conducting layer in the insulating layer 140 is depicted herein. In the embodiment, the first openings 190 are located in the insulating layer 140 to correspondingly expose the sensing units 170.

In one embodiment, the signal pad region 160 is located outside of the sensing region or device region 200 and comprises a plurality of conducting pads, which may be a single conducting layer or comprise multiple conducting layers. To simplify the diagram, only one conducting pad formed of a single conducting layer in the insulating layer 140 is depicted herein as an example. In the embodiment, the insulating layer 140 may further comprise one or more second openings 180 exposing the respective conducting pads.

In one embodiment, the chip 100 further comprises a shallow recess structure. The shallow recess structure is formed of a first recess 220 outside of the signal pad region 160 and extending from the upper surface 100a toward the lower surface 100b along the sidewall of the chip 100. The first recess 220 has a first sidewall 220a and a first bottom 220b. In one embodiment, the first sidewall 220a of the first recess 220 adjoins the insulating layer 140 and exposes a surface of the underlying substrate 150. In the embodiment, the first recess 220 has a depth D1 (shown in FIG. 2B) no greater than 15 μm. In one embodiment, the first recess 220 is formed by etching the insulating layer 140 and has a first sidewall 220a substantially perpendicular to the upper surface 100a. For example, the angle between the first sidewall 220a of the first recess 220 and the upper surface 100a may be in a range of about 84° to about 90°. In addition, in another embodiment, the first recess 220 is formed by dicing the insulating layer 140 and the angle between the first sidewall 220a of the first recess 220 and the upper surface 100a may be in a range of about 55° to about 90°.

In one embodiment, an optional insulating layer 260 may be conformally disposed on the upper surface 100a of the chip 100, extend into the first openings 190, the second opening 180 and the first recess 220, and expose a portion of the sensing units 170 and the signal pad region 160. In the embodiment, the insulating layer 260 may comprise inorganic materials, such as silicon oxide, silicon nitride, silicon oxynitride, metal oxide, a combination thereof, or another suitable insulating material.

The conductive extending portions 280a are disposed in the first openings 190 and electrically connected to the respective sensing units 170. Moreover, the conductive extending portions 280a extend from the first openings 190 onto the upper surface 100a of the chip 100. As shown In FIG. 6, the size of the overlying conductive extending portion 280a is greater than that of the underlying sensing unit 170. However, it should be realized that the size and shape of the conductive extending portion 280a or the sensing unit 170 may have other arrangements as long as the conductive extending portion 280a extends up onto the upper surface 100a of the chip 100. In one embodiment, the conductive extending portions 280a may comprise copper, aluminum, gold, platinum, nickel, tin, a combination thereof, conductive polymer materials, conductive ceramic materials, such as indium tin oxide or indium zinc oxide, or another suitable conducting material.

A patterned redistribution layer (RDL) 280b conformally extends into the second opening 180 and onto the first sidewall 220a and the first bottom 220b of the first recess 220. The redistribution layer 280b may be electrically connected to the signal pad region 160 through the second opening 180. In one embodiment, the redistribution layer 280b is disposed on the insulating layer 260 and therefore it can be prevented from electrically contacting the substrate 150. In one embodiment, the redistribution layer 280b may comprise copper, aluminum, gold, platinum, nickel, tin, a combination thereof, conductive polymer materials, conductive ceramic materials, such as indium tin oxide or indium zinc oxide, or another suitable conducting material. In one embodiment, the conductive extending portions 280a and the redistribution layer 280b are formed of the same layer.

A protection layer 300 is conformally disposed on the conductive extending portions 280a, the redistribution layer 280b and the insulating layer 260 and extends into the first openings 190, the second opening 180 and the first recess 220. The protection layer 300 comprises one or more openings exposing a portion of the redistribution layer 280b. In the embodiment, the protection layer 300 comprises openings 320 and 340 respectively exposing the redistribution layer 280b on the signal pad region 160 and in the first recess 220. In another embodiment, the redistribution layer 280b or the conductive extending portion 280a may be exposed. In other embodiments, the protection layer 300 may merely comprise the opening 340, for example, the opening 320 on the signal pad region 160 is covered. In the embodiment, the protection layer 300 may comprise inorganic materials, such as silicon oxide, silicon nitride, silicon oxynitride, metal oxide, a combination thereof, or another suitable insulating material.

An external component 380 may be attached onto the lower surface 100b of the chip 100 by an adhesive layer (such as a glue) 360. In the embodiment, the external component 380 may be a circuit board, a chip or an interposer. Taking the circuit board as an example, it may have one or more contact pad regions 400 on a surface thereof.

A wire 440 has a first end 440a and a second end 440b, wherein the first end 440a is in the shallow recess structure and electrically connected to the redistribution layer 280b, the second end 440b is used for external electrical connection and a portion of the wire 440 protrudes from the upper surface 100a of the chip 100. For example, the wire 440 may be electrically connected to the contact pad region 400 of the circuit board 380 by the second end 440b, and be electrically connected to the redistribution layer 280b on the first bottom 220b of the first recess 220 by the first end 440a, wherein the highest portion 440c of the wire 440 protrudes from the upper surface 100a of the chip 100. In the embodiment, although taking that a portion of the wire 440 protrudes from the upper surface 100a as an example, it is not limited thereto. In other embodiments, the wire 440 may be lower than the upper surface 100a through the shallow recess structure.

In the embodiment, the chip package may further comprise an encapsulant layer 460 optionally covering the wire 440 and the shallow recess structure, or it may further extend onto the upper surface 100a of the chip 100 to form a flat contacting surface above the sensing region or device region 200. The encapsulant layer 460 is generally formed of molding materials or sealing materials.

In one embodiment, a decorative layer 480 may additionally be disposed on the encapsulant layer 460 and may have colors according to design demands to show regions having sensing functions. A protection layer (such as sapphire substrate or hard rubber) 500 may be additionally disposed on the decorative layer 480 to further provide an abrasion-resistant, scrape-proof and high-reliability surface, thereby preventing the sensing device from being contaminated or damaged while the sensing functions of the chip package are being executed.

In general, at least a passivation layer or an inter-metal dielectric layer is disposed on a sensing element in a sensing chip, such that the sensing element is far from the human machine interface and the passivation layer or the inter-metal dielectric layer causes the signals to decay. Thus, the detection capability of the sensing element is reduced.

According to the aforementioned embodiments, the conductive extending portions 280a, which are formed of the same material layer as the redistribution layer 280b, are disposed in the first openings 190 and are electrically connected to the respective sensing units 170, such that the conductive extending portions 280a are parts of the sensing array, as shown in FIG. 6. Since the conductive extending portions 280a extend from the first openings 190 onto the upper surface 100a of the chip 100 to be situated much closer to the overlying flat contacting surface, the distance between the sensing array and the flat contacting surface can be reduced through the conductive extending portions 280a without affecting other circuits in the insulating layer 140. Therefore, the sensitivity of the sensing array is improved, and the thickness of the encapsulant layer 460 or the protection layer 500 on the sensing array can be increased to improve the protection and structural strength of the chip package while the sensing array still has the sufficient sensitivity. Moreover, since the parts of the sensing array (i.e., the conductive extending portions 280a) extend up onto the upper surface 100a of the chip 100, the size of the underlying sensing units 170 can be optionally reduced, which allows greater space and flexibility in routing circuits in the insulating layer 140.

In addition, a distance H1 is defined from the highest portion 440c of the wire 440 to the bottom of the shallow recess structure (i.e., the first bottom 220b of the first recess 220). The shallow recess structure has a depth H2 (i.e., the depth D1 of the first recess 220). The encapsulant layer 460 covering the sensing region or device region 200 has a thickness H3 determined by the difference between the distance H1 from the highest portion 440c of the wire 440 to the bottom of the shallow recess structure and the depth H2 of the shallow recess structure (i.e., H1–H2). Therefore, the thickness H3 of the encapsulant layer 460 covering the sensing region or device region 200 can be reduced by adjusting the depth H2 of the shallow recess structure, such that the sensitivity of the sensing region is increased and a flat contacting surface is formed. In addition, since the shallow recess structure is formed without removing too much substrate material, the structural strength of the substrate can be maintained.

Figure 3:
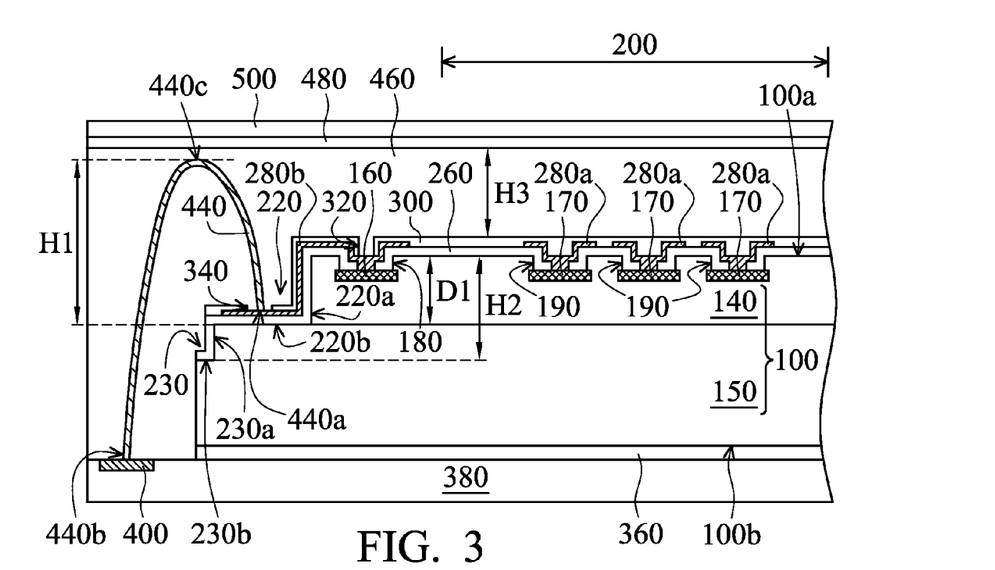
FIGS. 3 to 5 are cross-sectional views of various exemplary embodiments of a chip package according to the invention.
Figure 4:
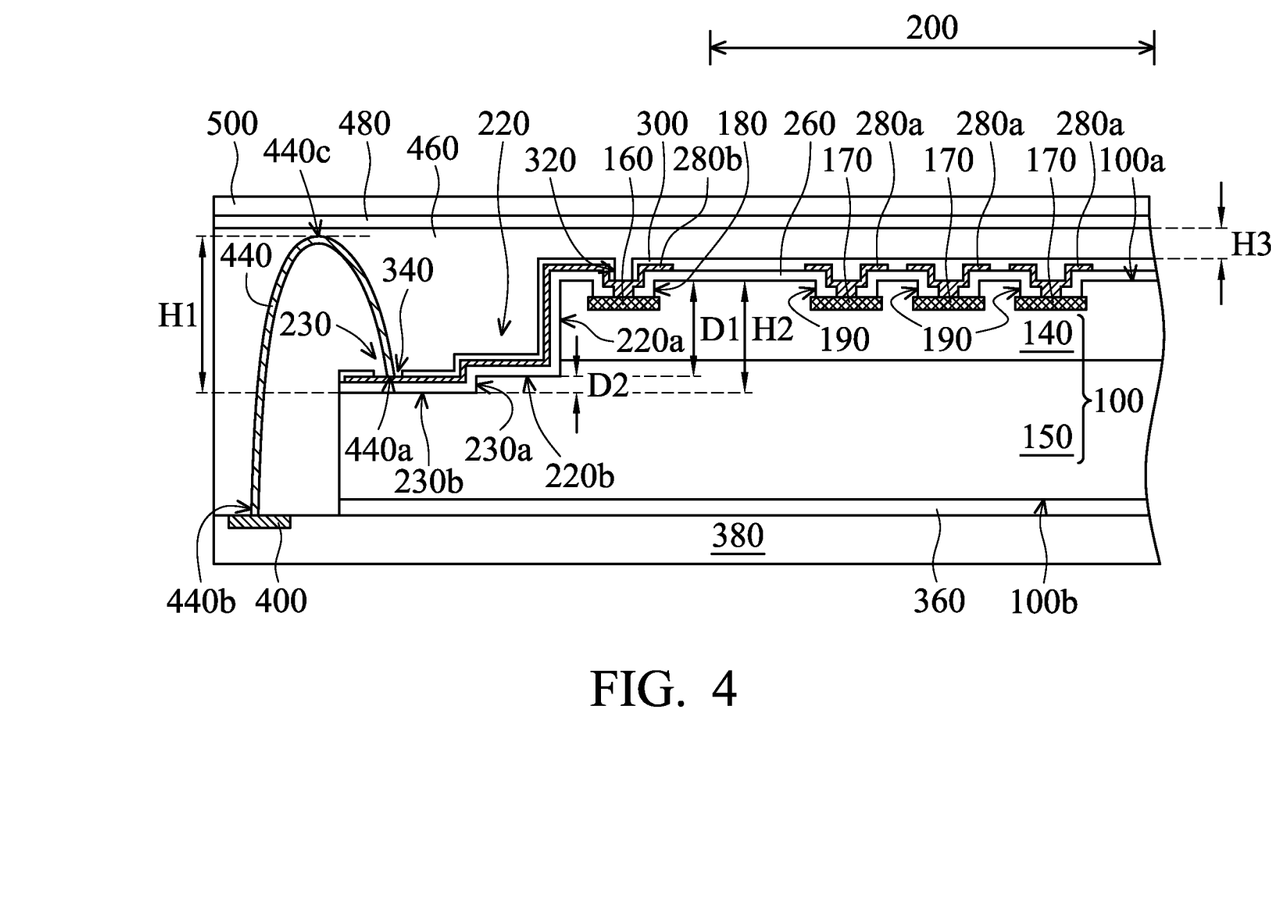
Figure 5:
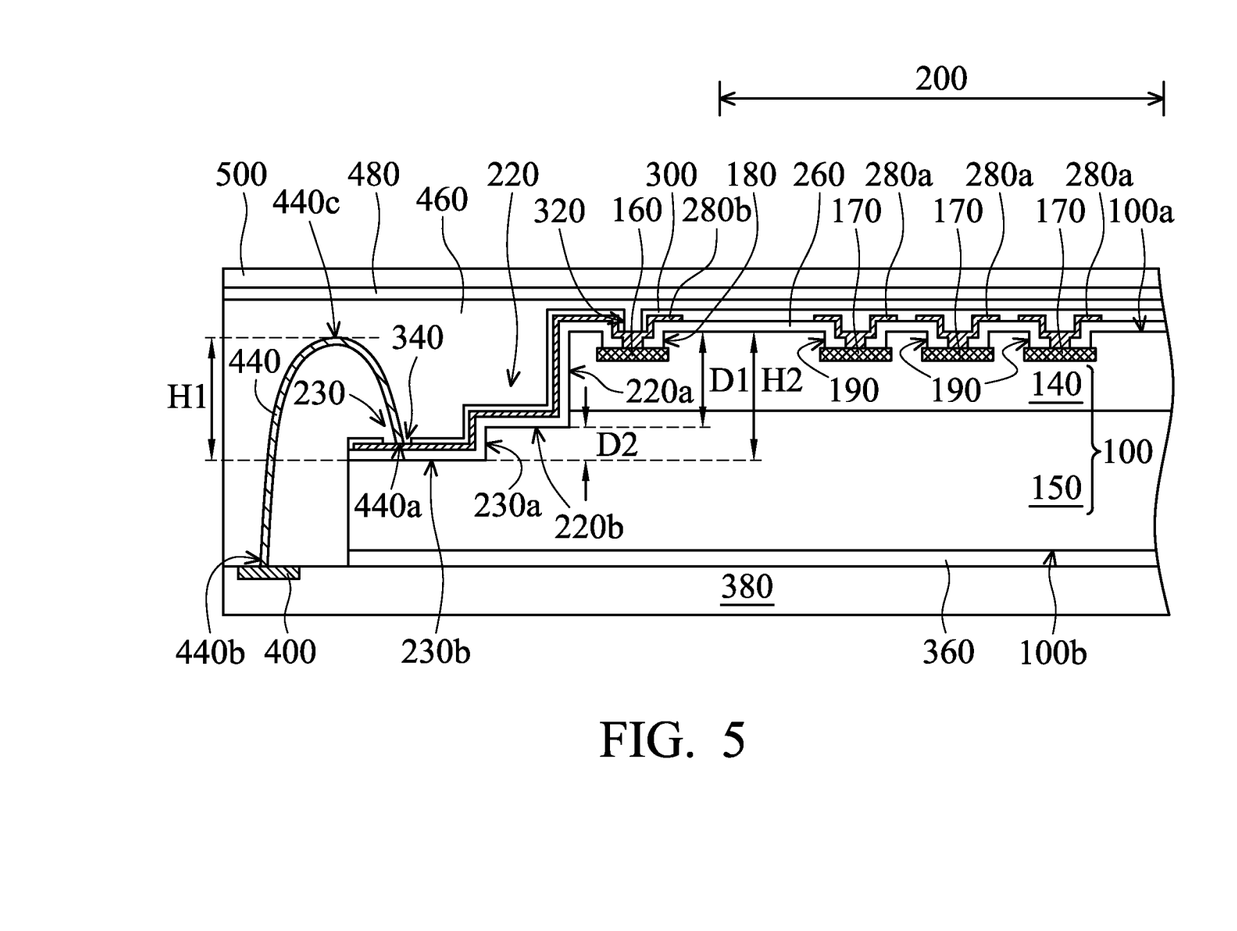

Referring to FIGS. 3 to 5, cross-sectional views of various exemplary embodiments of a chip package according to the invention are illustrated, wherein elements in FIGS. 3 to 5 that are the same as those in FIG. 2G are labeled with the same reference numbers as in FIG. 2G and are not described again for brevity. The chip package structure shown in FIG. 3 is similar to that shown in FIG. 2G. The difference therebetween is that the chip package structure shown in FIG. 3 further comprises a second recess 230 extending from the first bottom 220b of the first recess 220 toward the lower surface 100b. The second recess 230 has a second sidewall 230a and a second bottom 230b, wherein the second sidewall 230a of the second recess 230 adjoins the substrate 150. The underlying second recess 230 has a lateral width that is narrower than that of the overlying first recess 220. In the embodiment, the insulating layer 260 extends to the second sidewall 230a and the second bottom 230b of the second recess 230.

In the embodiment, a distance H1 is defined from the highest portion 440c of the wire 440 to the first bottom 220b of the first recess 220. The encapsulant layer 460 covering the sensing region or device region 200 has a thickness H3 determined by the difference between the distance H1 from the highest portion 440c of the wire 440 to the bottom of the shallow recess structure and the depth D1 of the first recess 220 (i.e., H1–D1).

In the embodiment, the first end 440a of the wire 440 is in electrical contact with the redistribution layer 280b on the first bottom 220b of the overlying first recess 220. Accordingly, the maximum height of the wire 440 can be reduced further. Furthermore, since the space between the wire 440 and the first bottom 220b of the first recess 220 is increased by the second recess 230, the possibility of the wire coming into contact with the edge of the first recess 220, resulting in a short circuit or a broken circuit, can be also reduced.

The chip package structure shown in FIG. 4 is similar to that shown in FIG. 3. The difference therebetween is that the underlying second recess 230 shown in FIG. 4 has a lateral width that is wider than that of the overlying first recess 220. Furthermore, the redistribution layer 280b further extends to the second sidewall 230a and the second bottom 230b of the underlying second recess 230 and the first end 440a of the wire 440 electrically contacts the redistribution layer 280b on the second bottom 230b of the underlying second recess 230 through the opening 340. In addition, the overlying first recess 220 penetrates through the insulating layer 140 and may further extend into the underlying substrate 150, such that the first sidewall 220a may adjoin the insulating layer 140 and a portion of the underlying substrate 150.

In the embodiment, a distance H1 is defined from the highest portion 440c of the wire 440 to the bottom of the shallow recess structure (i.e., the second bottom 230b of the second recess 230). The shallow recess structure has a depth H2 which is the combined depth of the first recess 220 and the second recess 230 (i.e., D1+D2). The encapsulant layer 460 covering the sensing region or device region 200 has a thickness H3 determined by the difference between the distance H1 from the highest portion 440c of the wire 440 to the bottom of the shallow recess structure and the depth H2 of the shallow recess structure (i.e., H1−H2).

In the embodiment, the second recess 230 further extends into the substrate 150 and therefore the highest height of the wire 440 can be reduced further while the structural strength of the substrate can still be maintained. Undercutting at an interface between the insulating layer 140 and the substrate 150, which may result in over-etching by directly extending the first recess 220 downward, can be prevented.

In other embodiments, the second end 440b of the wire 440 is an initial end for wire bonding and the first end 440a is subsequently formed on the redistribution layer 280b.

The chip package structure shown in FIG. 5 is similar to that shown in FIG. 4. The difference therebetween is that the depth of the second recess 230 shown in FIG. 5 is greater than that of the second recess 230 shown in FIG. 4. Furthermore, the highest portion 440c of the wire 440 is lower than the upper surface 100a of the chip 100. For example, the distance H1 from the highest portion 440c of the wire 440 to the bottom of the shallow recess structure (i.e., the second bottom 230b of the second recess 230) is less than the depth H2 of the shallow recess structure. Thus, the thickness of the encapsulant layer 460 covering the sensing region or device region 200 can be significantly reduced, thereby further improving the sensitivity of the sensing region.

An exemplary embodiment of a method for forming a chip package according to the invention is illustrated with FIGS. 2A to 2G, wherein FIGS. 2A to 2G are cross-sectional views of an exemplary embodiment of a method for forming a chip package according to the invention.

Referring to FIG. 2A, a wafer having chip regions 120 is provided. The chip regions 120 comprise a plurality of chips 100. Each chip 100 has an upper surface 100a and a lower surface 100b. In one embodiment, the chip 100 comprises a substrate 150 adjacent to the lower surface 100b and an insulating layer 140 adjacent to the upper surface 100a. In general, the insulating layer 140 may comprise an interlayer dielectric (ILD), an inter-metal dielectric (IMD) and a passivation layer. In the embodiment, the insulating layer 140 may comprise inorganic materials, such as silicon oxide, silicon nitride, silicon oxynitride, metal oxide, a combination thereof, or another suitable insulating material. In the embodiment, the substrate 150 may comprise silicon or another semiconductor material.

In one embodiment, each chip 100 comprises a sensing region or device region 200, which may be adjacent to the upper surface 100a and may be used for sensing capacitance. For example, the chip 100 may be a RF/capacitive fingerprint-recognition chip. The sensing region or device region 200 comprises a sensing array as shown in FIG. 6. The sensing array comprises a plurality of sensing units 170 in the insulating layer 140 and electrically connected to the signal pad region 160. In the embodiment, the insulating layer 140 comprises the first openings 190 to expose the respective sensing units 170.

In the embodiment, each chip 100 comprises one or more signal pad regions 160 which may be adjacent to the upper surface 100a, and comprises a plurality of conducting pads. To simplify the diagram, only one chip region 120 and one conducting pad in the insulating layer 140 are depicted as an example. In one embodiment, the conducting pad may be a single conducting layer or comprise multiple conducting layers. Herein, a single conducting layer is illustrated as an example. In the embodiment, the insulating layer 140 may further comprise one or more second openings 180 exposing the respective conducting pads. In one embodiment, the first openings 190 and the second opening 180 may be simultaneously formed by the same lithography and etching processes. Moreover, the depth of the first openings 190 may be the same as that of the second opening 180.

Referring to FIG. 2B, a shallow recess structure may be formed in each chip 100 by lithography and etching processes (the etching process may comprise a dry etching process, a wet etching process, a plasma etching process, a reactive ion etching process or another suitable process). For example, a first recess 220 is formed in the insulating layer 140, extends from the upper surface 100a toward the lower surface 100b along a scribe line (not shown), and then penetrates the insulating layer 140 to expose the underlying substrate 150. Namely, the first recess 220 has a depth nearly equal to or slightly deeper than the thickness of the insulating layer 140. In the embodiment, the depth D1 of the first recess 220 is no greater than 15 μm. In one embodiment, the first recess 220 formed by an etching process has a first sidewall 220a substantially perpendicular to the upper surface 100a. For example, the angle between the first sidewall 220a of the first recess 220 and the upper surface 100a may be in a range of about 84° to about 90°. In another embodiment, the first recess 220 is formed by a dicing process and the first sidewall 220a is substantially inclined to the upper surface 100a. For example, the angle between the first sidewall 220a of the first recess 220 and the upper surface 100a may be in a range of about 55° to about 90°.

Referring to FIG. 2C, an insulating layer 260 may be conformally formed on the upper surface 100a of the chip 100 by a deposition process (such as a coating process, a chemical vapor deposition process, a physical vapor deposition process or another suitable process) and extend to the first openings 190 and the second opening 180 of the insulating layer 140 and the first recess 220. In the embodiment, the insulating layer 260 may comprise inorganic materials, such as silicon oxide, silicon nitride, silicon oxynitride, metal oxide, a combination thereof, or another suitable insulating material.

Next, the insulating layer 260 in the first openings 190 and the second opening 180 is removed by lithography and etching processes (the etching process may comprise a dry etching process, a wet etching process, a plasma etching process, a reactive ion etching process or another suitable process) to expose a portion of the sensing units 170 and the signal pad region 160.

Referring to FIG. 2D, a conducting layer may be formed on the insulating layer 260 by a deposition process (such as a coating process, a chemical vapor deposition process, a physical vapor deposition process, an electroplating process, an electroless plating process or another suitable process) and extends into the first openings 190, the second opening 180 and the first recess 220. In one embodiment, the conducting layer may comprise copper, aluminum, gold, platinum, nickel, tin, a combination thereof, conductive polymer materials, conductive ceramic materials (such as indium tin oxide or indium zinc oxide) or another suitable conducting material.

Next, the conducting layer may be patterned by lithography and etching processes to simultaneously form a plurality of conductive extending portions 280a and a patterned redistribution layer 280b. The conductive extending portions 280a are located in the first openings 190 and electrically connected to the respective sensing units 170. Moreover, the conductive extending portions 280a extend from the first openings 190 onto the upper surface 100a of the chip 100.

The redistribution layer 280b on the insulating layer 260 conformally extends into the second opening 180 and onto the first sidewall 220a and the first bottom 220b of the first recess 220, and is electrically connected to the exposed signal pad region 160 through the second opening 180. In one embodiment, the redistribution layer 280b does not reach the edge of the first bottom 220b of the first recess 220. Moreover, when the substrate 150 comprises a semiconductor material, the redistribution layer 280b can be electrically insulated from the semiconductor material by the insulating layer 260.

Referring to FIG. 2E, a protection layer 300 may be conformally formed on the conductive extending portions 280a, the redistribution layer 280b and the insulating layer 260 by a deposition process (such as a coating process, a chemical vapor deposition process, a physical vapor deposition process or another suitable process) and extend into the first openings 190, the second opening 180 and the first recess 220. In another embodiment, the redistribution layer 280b or the conductive extending portion 280a may be exposed. In the embodiment, the protection layer 300 may comprise inorganic materials, such as silicon oxide, silicon nitride, silicon oxynitride, metal oxide, a combination thereof, or another suitable insulating material.

Next, one or more openings may be formed in the protection layer 300 by lithography and etching processes (the etching process may comprise a dry etching process, a wet etching process, a plasma etching process, a reactive ion etching process or another suitable process) to expose a portion of the redistribution layer 280b. In the embodiment, openings 320 and 340 are formed in the protection layer 300 to respectively expose the redistribution layer 280b in the second opening 180 and the first recess 220.

In other embodiments, only the opening 340 may be formed in the protection layer 300. It should be realized that the number and position of the opening in the protection layer 300 are determined by design demands and it is not limited thereto.

Next, a dicing process is performed in the wafer along the scribe lines (not shown) to form a plurality of independent chips 100. After performing the dicing process, the first recess 220 of each chip 100 extends from the upper surface 100a toward the lower surface 100b along a sidewall of the chip 100.

Next, referring to FIG. 2F, an external component 380 may be attached onto the lower surface 100b of the substrate 150 of the independent chip 100 by an adhesive layer (such as a glue) 360. In the embodiment, the external component 380 may be a circuit board, a chip or an interposer. Taking the circuit board as an example, the external component 380 may comprise one or more contact pad regions 400. Similarly, the contact pad region 400 may comprise a plurality of conducting pad which may be a single conducting layer or comprise multiple conducting layers. To simplify the diagram, only one contact pad region 400 formed of a single conducting layer is depicted herein as an example.

Next, a wire 440 having an second end 440b to be initially formed on the contact pad region 400 of the external component 380 and having a first end 440a electrically connected to the redistribution layer 280b on the first bottom 220b of the first recess 220 is formed by a wire bonding process. In the embodiment, the wire 440 comprises the highest portion 440c having a distance H1 between the highest portion 440c and the first bottom 220b of the first recess 220. In the embodiment, the wire 440 may comprise gold or another suitable conducting material.

In another embodiment, as shown in FIG. 3, a portion of the substrate 150 is removed by an etching or dicing process to form a second recess 230 extending from the first bottom 220b of the first recess 220 toward the lower surface 100b. The second recess 230 has a second sidewall 230a and a second bottom 230b, wherein the second sidewall 230a of the second recess 230 adjoins the substrate 150 and the underlying second recess 230 has a lateral width that is narrower than that of the overlying first recess 220. In the embodiment, the insulating layer 260 extends to the second sidewall 230a and the second bottom 230b of the second recess 230.

In the embodiment, the first end 440a of the wire 440 electrically contacts the redistribution layer 280b on the first bottom 220b of the overlying first recess 220. Accordingly, the highest height of the wire 440 can be reduced further. Furthermore, since the space between the wire 440 and the first bottom 220b of the first recess 220 is increased by the second recess 230, the possibility of the wire coming into contact with the edge of the first recess 220, resulting in a short circuit or a broken circuit, can be also reduced In yet another embodiment, the chip package structure shown in FIG. 4 is similar to that shown in FIG. 3. The difference therebetween is that the underlying second recess 230 shown in FIG. 4 has a lateral width that is wider than that of the overlying first recess 220. Furthermore, the redistribution layer 280b further extends to the second sidewall 230a and the second bottom 230b of the underlying second recess 230 but does not reach the edge of the second bottom 230b. The first end 440a of the wire 440 electrically contacts the redistribution layer 280b on the second bottom 230b of the underlying second recess 230 through the opening 340.

In the embodiment, since the second recess 230 further extends into the substrate 150, the highest height of the wire 440 can be reduced further while the structural strength of the substrate can still be maintained. Moreover, undercutting at an interface between the insulating layer 140 and the substrate 150, which results in the over-etching by directly extending downward the first recess 220, can be prevented.

In yet another embodiment, the chip package structure shown in FIG. 5 is similar to that shown in FIG. 4. The difference therebetween is that the depth of the second recess 230 shown in FIG. 5 is greater than that of the second recess 230 shown in FIG. 4. Furthermore, the highest portion 440c of the wire 440 is lower than the upper surface 100a of the chip 100. For example, the distance H1 from the highest portion 440c of the wire 440 to the bottom of the shallow recess structure (i.e., the second bottom 230b of the second recess 230) is less than the depth H2 of the shallow recess structure.

Next, referring to FIG. 2G, an encapsulant layer 460 may be formed on the upper surface 100a of the chip 100 by a molding process or another suitable process. The encapsulant layer 460 may optionally cover the first recess 220, the second recess 230 (as shown in FIG. 2 and FIG. 3), the external component 380 and the wire 440, or it may further extend onto the upper surface 100a of the chip 100 to form a flat contacting surface above the sensing region or device region 200.

Next, a decorative layer 480 may be formed on the encapsulant layer 460 by a deposition process (such as a coating process or another suitable process) and may have colors according to design demands to show regions having sensing functions. Next, a protection layer (such as sapphire substrate or hard rubber) 500 may be formed on the decorative layer 480 by a deposition process (such as a coating process, a physical vapor deposition process, a chemical vapor deposition process or another suitable process) to further provide an abrasion-resistant, scrape-proof and high-reliability surface.

According to the aforementioned embodiments, the first openings 190 and the second opening 180 can be simultaneously formed by the same process and the conductive extending portions 280a and the redistribution layer 280b can be simultaneously formed by the same process. The conductive extending portions 280a electrically connected to the respective sensing units 170 are parts of the sensing array and extend from the first openings 190 onto the upper surface 100a of the chip 100, such that the distance between the sensing array and the overlying flat contacting surface can be reduced through the conductive extending portions 280a. Therefore, the sensitivity of the sensing array is increased without additional steps or processes and manufacturing cost.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
a chip including a semiconductor substrate, comprising:
a sensing region or device region adjacent to an upper surface of the chip; and
a sensing array in the sensing region or device region and comprising a plurality of sensing units that measure changes to external physical quantities;
a plurality of first openings in the chip and correspondingly exposing the plurality of sensing units; and
a plurality of conductive extending portions disposed in the plurality of first openings and electrically connected to the plurality of sensing units, wherein the plurality of conductive extending portions extends from the plurality of first openings onto the upper surface of the chip.

2. The chip package as claimed in claim 1, wherein the chip is a fingerprint-recognition chip.

3. The chip package as claimed in claim 1, wherein the chip further comprises a signal pad region adjacent to the upper surface and outside of the sensing region or device region, and wherein the chip package further comprises:
a second opening in the chip and exposing the signal pad region;
a shallow recess structure outside of the signal pad region and extending from the upper surface toward a lower surface of the chip; and
a redistribution layer electrically connected to the signal pad region through the second opening and extending into the shallow recess structure.

4. The chip package as claimed in claim 3, wherein the plurality of conductive extending portions and the redistribution layers are formed of a same material layer.

5. The chip package as claimed in claim 3, further comprises a wire having a first end and a second end, wherein the first end is disposed in the shallow recess structure and electrically connected to the redistribution layer, and the second end is used for external electrical connection.

6. The chip package as claimed in claim 5, wherein a highest portion of the wire is lower than the upper surface of the chip.

7. The chip package as claimed in claim 5, wherein the first end and the second end of the wire are lower than the upper surface of the chip, and a highest portion of the wire protrudes from the upper surface of the chip.

8. The chip package as claimed in claim 7, further comprising an encapsulant layer covering the wire and the upper surface to form a flat contacting region above the sensing region or device region, wherein a thickness of the encapsulant layer covering the sensing region or device region is determined by a difference between a distance from the highest portion of the wire to a bottom of the shallow recess structure and a depth of the shallow recess structure.

9. The chip package as claimed in claim 3, wherein the shallow recess structure has at least a first recess and a second recess under the first recess, and wherein the redistribution layer extends to a first sidewall and a first bottom of the first recess.

10. The chip package as claimed in claim 9, wherein the second recess extends from the first bottom of the first recess toward the lower surface of the chip.

11. The chip package as claimed in claim 9, wherein the redistribution layer further extends to a second sidewall and a second bottom of the second recess.

12. The chip package as claimed in claim 9, wherein the chip comprises a substrate and an insulating layer, and wherein the first sidewall of the first recess adjoins the insulating layer and a portion of the substrate and a second sidewall of the second recess adjoins the substrate.

13. A method for forming a chip package, comprising:
providing a chip including a semiconductor substrate, wherein the chip comprises:
a sensing region or device region adjacent to an upper surface of the chip; and
a sensing array in the sensing region or device region and comprising a plurality of sensing units that measure changes to external physical quantities;
forming a plurality of first openings in the chip to correspondingly expose the plurality of sensing units; and
forming a plurality of conductive extending portions in the plurality of first openings to electrically connect to the plurality of sensing units, wherein the plurality of conductive extending portions extends from the plurality of first openings onto the upper surface of the chip.

14. The method as claimed in claim 13, wherein the chip is a fingerprint-recognition chip.

15. The method as claimed in claim 13, wherein the chip further comprises a signal pad region adjacent to the upper surface and outside of the sensing region or device region, and wherein the step of forming the plurality of first openings further comprises forming a second opening in the chip to expose the signal pad region.

16. The method as claimed in claim 15, wherein the step of forming the plurality of conductive extending portions comprises:

forming a conducting layer on the upper surface of the chip and extending into the plurality of first openings; and patterning the conducting layer to form the plurality of conductive extending portions.

17. The method as claimed in claim 16, further comprising forming a shallow recess structure outside of the signal pad region and extending from the upper surface toward a lower surface of the chip, wherein the conducting layer further extends into the second opening and the shallow recess structure.

18. The method as claimed in claim 17, wherein the step of patterning the conducting layer further comprises forming a redistribution layer electrically connected to the signal pad region through the second opening and extending into the shallow recess structure.

19. The method as claimed in claim 18, further comprising bonding a wire having a first end and a second end to the chip, wherein the first end is formed in the shallow recess structure and is electrically connected to the redistribution layer, the second end is used for external electrical connection.

20. The method as claimed in claim 19, wherein the second end of the wire is an initial end for wire bonding.

21. The method as claimed in claim 19, wherein a highest portion of the wire is lower than the upper surface of the chip.

22. The method as claimed in claim 19, wherein the first end and the second end of the wire are lower than the upper surface of the chip, and a highest portion of the wire protrudes from the upper surface of the chip.

23. The method as claimed in claim 22, further comprising covering the wire and the upper surface by an encapsulant layer to form a flat contacting region above the sensing region or device region, wherein a thickness of the encapsulant layer covering the sensing region or device region is determined by a difference between a distance from the highest portion of the wire to a bottom of the shallow recess structure and a depth of the shallow recess structure.

24. The method as claimed in claim 18, wherein the shallow recess structure has at least a first recess and a second recess under the first recess, and wherein the redistribution layer extends to a first sidewall and a first bottom of the first recess.

25. The method as claimed in claim 24, wherein the second recess extends from the first bottom of the first recess toward the lower surface of the chip.

26. The method as claimed in claim 24, wherein the redistribution layer further extends to a second sidewall and a second bottom of the second recess.

27. The method as claimed in claim 24, wherein the chip comprises a substrate and an insulating layer, and wherein the first sidewall of the first recess adjoins the insulating layer and a portion of the substrate and a second sidewall of the second recess adjoins the substrate.

* * * * *